(12) United States Patent
Lee

(10) Patent No.: US 6,242,340 B1
(45) Date of Patent: Jun. 5, 2001

(54) METHOD FOR FORMING AN INTERCONNECTION IN A SEMICONDUCTOR DEVICE

(75) Inventor: Won-Jun Lee, Seoul (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/362,898

(22) Filed: Jul. 29, 1999

(30) Foreign Application Priority Data

Jan. 20, 1999 (KR) .................................................. 99-1660

(51) Int. Cl.[7] .............................................. H01L 21/4763
(52) U.S. Cl. .......................... 438/624; 438/627; 438/634; 438/639
(58) Field of Search .................................. 438/622, 623, 438/624, 627, 629, 634, 639, 672

(56) References Cited

U.S. PATENT DOCUMENTS

| | | | |
|---|---|---|---|
| 4,349,609 | * | 9/1982 | Takeda et al. ........................ 438/623 |
| 5,244,837 | * | 9/1993 | Dennison ............................. 438/624 |
| 5,444,021 | * | 8/1995 | Chung et al. ........................ 438/634 |
| 5,612,254 | * | 3/1997 | Mu et al. ............................. 438/620 |
| 5,658,830 | * | 8/1997 | Jeng .................................... 438/620 |
| 5,686,354 | * | 11/1997 | Avanzino et al. .................... 438/653 |
| 5,739,579 | | 4/1998 | Chiang et al. ........................ 257/635 |
| 5,759,906 | * | 6/1998 | Lou ..................................... 438/623 |
| 5,795,823 | * | 8/1998 | Avanzino et al. .................... 438/639 |
| 6,156,648 | * | 12/2000 | Huang .................................. 438/654 |

FOREIGN PATENT DOCUMENTS 0 790 645 A2  *  8/1997  (EP) .
11-297829  *  10/1999  (JP) .

* cited by examiner

*Primary Examiner*—T. N. Quach
(74) *Attorney, Agent, or Firm*—Fleshner & Kim, LLP

(57) ABSTRACT

A method of forming an interconnection layer in a semiconductor device is provided that improves the mass productivity and the reliability of the interconnection by forming a sidewall spacer on the sidewalls of a trench that is formed in an insulation film having a low dielectric constant. The sidewall spacer maintains the sidewall profile of the trench during subsequent processing steps.

17 Claims, 5 Drawing Sheets

METHOD FOR FORMING AN INTERCONNECTION IN A SEMICONDUCTOR DEVICE

BACKGROUND OF THE INVENTION

1. Field of the Invention

The present invention is directed to a method for manufacturing a semiconductor device, and in particular to a method for forming an interconnection in a semiconductor device.

2. Background of the Related Art

FIG. 1 illustrates a crystal structure of a hydrogen silsesquoxane (HSQ) which is a general insulation film with a low dielectric constant. As shown in FIG. 1, the insulation material with the low dielectric constant has a low volume density of atoms. However, if the insulation material is exposed to heat and plasma during a processing step, the insulation material is damaged, and thus cannot maintain its original profile.

FIGS. 2A to 2F are cross-sectional views illustrating a related art method for forming an interconnection in a semiconductor device using HSQ.

As depicted in FIG. 2A, a first insulation layer 2 with a first trench 2A is formed on a semiconductor substrate 1. The substrate 1 is a silicon wafer on which a semiconductor device has been manufactured, but not the interconnections. The upper portion of the substrate 1 is mostly planarized by chemical mechanical polishing or etchback. The first insulation film 2 is composed of layer insulation materials, such as BPSG, SOG and PE-TEOS.

If the first insulation layer 2 has inferior mechanical properties, such that it is difficult to carry out chemical mechanical polishing on a metal to be deposited, an insulation layer (not shown) such as a silicon oxide film may be formed on the first insulation layer 2 to act as an etch stopper during chemical mechanical polishing.

Then, a first barrier metal layer 3 is formed at the upper portion of the first insulation layer 2 and in the first trench 2a. A first metal layer 4 is formed on the first barrier metal layer 3. As a result, the first trench 2a is filled with the first metal layer 4. The first barrier metal layer 3 is one of Ti, Ti/TiN and TiW, and the first metal layer 4 is copper.

As illustrated in FIG. 2B, the first barrier metal layer 3 and the first metal layer 4 are partially removed by chemical mechanical polishing, so that the upper portion of the first insulation layer 2 is exposed, thereby forming a first interconnection layer 5 in the first trench 2a. Then, a second insulation layer 6, a third insulation layer 7 and a fourth insulation layer 8 are formed at the upper portions of the first insulation layer 2 and the first interconnection layer 5. The second insulation layer 6 consists of a silicon nitride which is a metal cap insulation material, the third insulation layer 7 consists of an insulation material with a low dielectric constant, and the fourth insulation layer 8 is composed of a silicon oxide. In general, hydrogen silsesquoxane (HSQ) is employed as the insulation material with the low dielectric constant.

As illustrated in FIG. 2C, portions of the third and fourth insulation layers 7, 8 corresponding to the first interconnection layer 5 are removed by reaction ion etching using a photoresist film pattern (not shown) as a mask. Thus, a second trench 7a is formed in the third insulation layer 7. The second insulation layer 6 functions as the etch stopper during the etching.

As depicted in FIG. 2D, the portion of the second insulation layer 6 exposed by the second trench 7a is removed by reaction ion etching using an oxygen plasma. As a result, the sidewalls of the third insulation layer 7 that are exposed to the second trench 7a are caved. In other words, when the insulation material with the low dielectric constant, such as the HSQ is used as the third insulation layer 7, hydrogen elements in the HSQ and oxygen elements in the oxygen plasma are combined, thereby caving the sidewalls of the third insulation layer 7.

As illustrated in FIG. 2E, a second barrier metal layer 9 is formed at the upper portion of the fourth insulation layer 8 and in the second trench 7a. A second metal layer 10 is then formed on the second barrier metal layer 9. As a result, the second trench 7a is filled with the second metal layer 10. The second barrier metal layer 9 is generally one of Ti, Ti/TiN and TiW. The second metal layer 10 is generally copper.

As depicted in FIG. 2F, the second metal layer 10 is chemically mechanically polished so that the upper portion of the fourth insulation layer 8 is exposed, and thus a second interconnection layer 11 is formed in the second trench 7a. As a result, the second interconnection layer 11 is connected to the first interconnection layer 5. However, a void 12 occurs at the center of the second trench 7a because the third insulation layer 7 is caved. The fourth insulation layer 8 functions as the etch stopper during the chemical mechanical polishing.

The related art method of forming interconnections in the semiconductor device has various disadvantages. For example, as illustrated in FIG. 2D, when the second insulation layer (silicon nitride layer) 6 is partially removed by etching in order to form the interconnection, a bowing occurs, namely the sidewalls of the third insulation layer (HSQ layer) 7 exposed in the second trench 7a are caved. Further, as depicted in FIG. 2E, a void 12 occurs at the center of the second trench 7a because the third insulation layer 7 is caved, thereby reducing the mass productivity and the reliability of the interconnections. Moreover, when the second barrier metal layer 9, as well as the second metal layer 10, are removed by chemical mechanical polishing in order to form the second interconnection layer 11 in the second trench 7a, two kinds of slurries must be used and two process conditions must be applied, thereby complicating the entire manufacturing process.

SUMMARY OF THE INVENTION

An object of the present invention is to solve at least the problems and/or disadvantages of the related art and prior art.

Another object of the present invention is to improve the mass productivity.

A further object of the present invention is to improve the reliability.

The present invention can be achieved in a whole or in parts by forming a sidewall spacer on the sidewalls of a trench formed in an insulation film with a low dielectric constant, so as to maintain the original sidewall profile of the trench during subsequent processing steps.

The present invention may be achieved in a whole or in parts by a method of forming an interconnection in a semiconductor device, comprising the steps of: (1) forming a first insulation layer on a semiconductor substrate; (2) forming a first trench in the first insulation layer; (3) forming a first interconnection layer in the first trench; (4) forming a second insulation layer on the first insulation layer and the first interconnection layer; (5) forming a third insulation layer on the second insulation layer; (6) forming a second trench in the third insulation layer; (7) forming a sidewall spacer on sidewalls of the second trench; (8) removing a portion of the second insulation layer exposed by the second trench; and (9) forming a second interconnection layer in the second trench.

The present invention may also be achieved in whole or in part by a method of forming an interconnection in a semiconductor device, comprising the steps of: (1) forming a first insulation layer on a substrate; (2) forming a second insulation layer on the first insulation layer; (3) forming a trench in the second insulation layer that exposes a portion of the first insulation layer; (4) forming a sidewall spacer on sidewalls of the trench; (5) removing the portion of the first insulation layer exposed by the trench; and (6) forming an interconnection layer in the trench, wherein the sidewall spacer is adapted to shield the sidewalls of the trench while the portion of the first insulation layer exposed by the trench is removed.

The present invention may also be achieved in whole or in part by a method of forming an interconnection in a semiconductor device, comprising the steps of: (1) forming a first insulation layer on a substrate; (2) forming a second insulation layer on the first insulation layer; (3) exposing a portion of the first insulation layer by forming a trench, having a sidewall profile, in the second insulation layer; (4) removing the portion of the first insulation layer exposed by the trench while maintaining the sidewall profile of the trench; and (5) forming an interconnection layer in the trench.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings, in which like reference numerals refer to like elements, wherein.

DETAILED DESCRIPTION OF PREFERRED EMBODIMENTS

FIGS. 3A to 3F are cross-sectional views illustrating a method for forming an interconnection in a semiconductor device, according to a preferred embodiment of the present invention.

Figure 1:
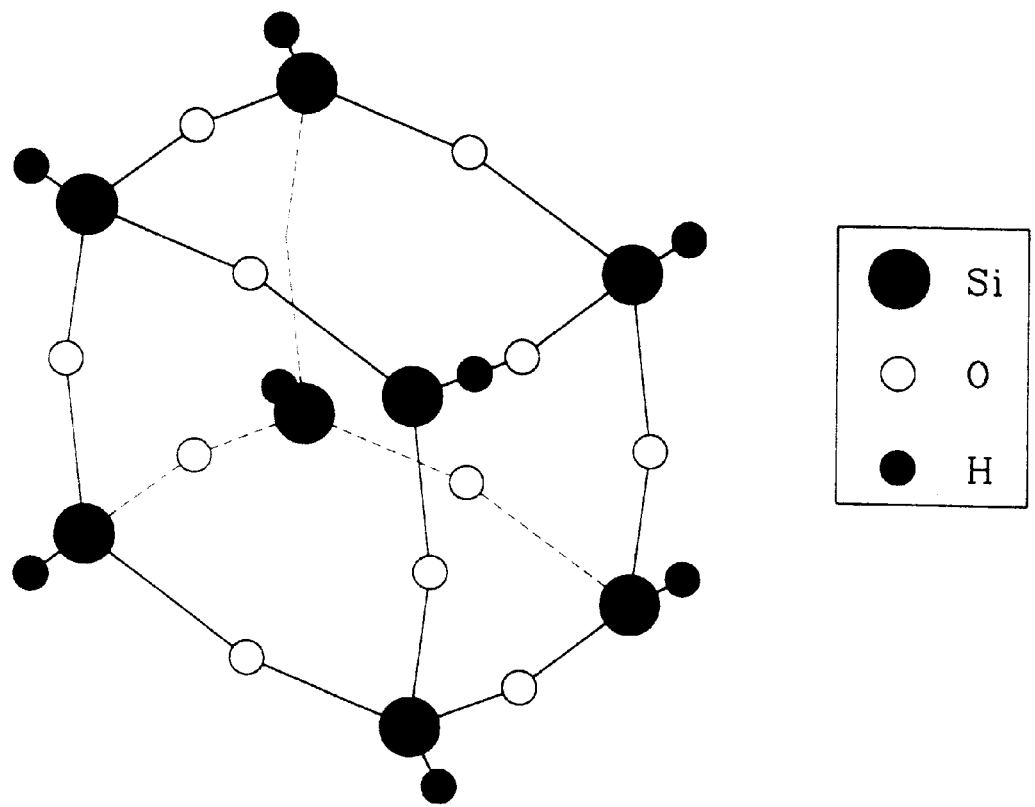
FIG. 1 is a three-dimensional view illustrating the crystal structure of hydrogen silsesquoxane (HSQ), which is an insulation material with a low dielectric constant.
Figure 2A:
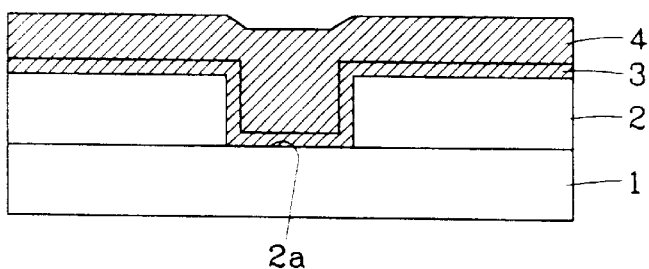
FIGS. 2A to 2F are vertical cross-sectional views sequentially illustrating a related art method for forming an interconnection in a semiconductor device.
Figure 2B:
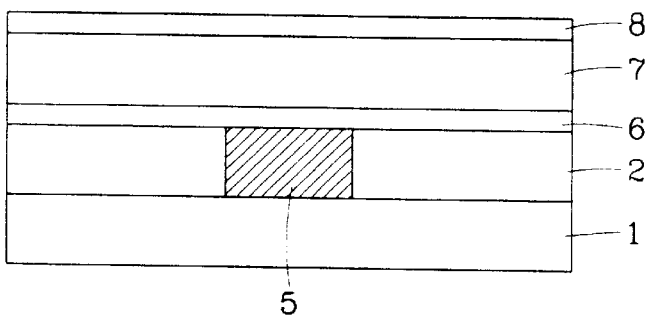
Figure 2C:
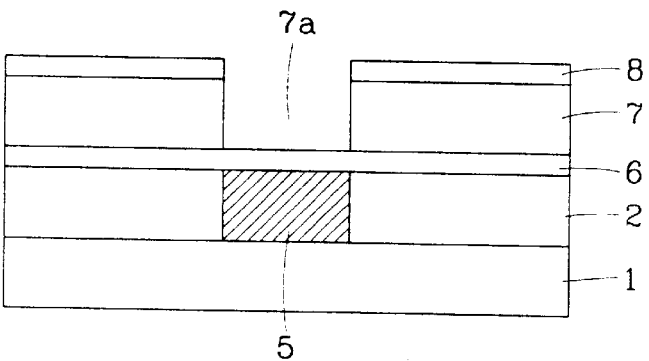
Figure 2D:
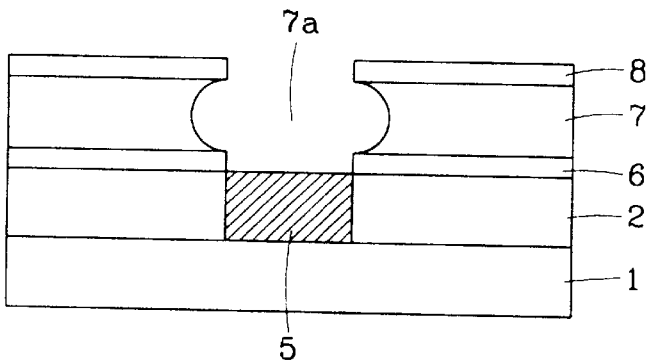
Figure 2E:
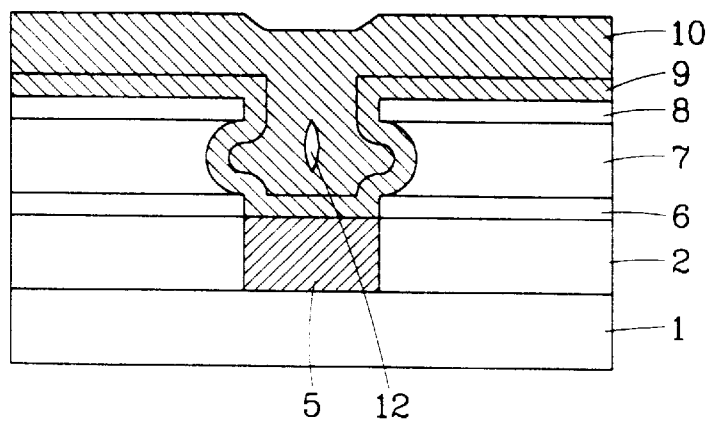
Figure 2F:
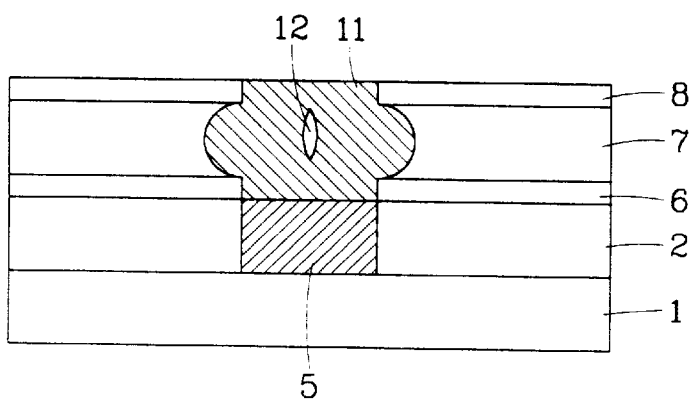
Figure 3A:
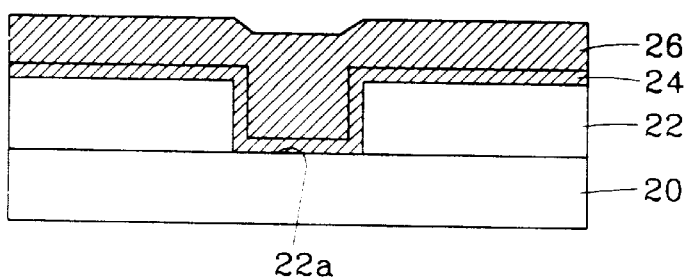
FIGS. 3A to 3F are vertical cross-sectional views sequentially illustrating a method for forming an interconnection in a semiconductor device, in accordance with a preferred embodiment of the present invention.

As depicted in FIG. 3A, a first insulation layer 22 with a first trench 22a is formed on a semiconductor substrate 20. The substrate 20 is a silicon wafer on which a semiconductor device has been formed, but not the interconnections. The upper portion of the substrate 20 has been substantially planarized, preferably by chemical mechanical polishing or by etchback. The first insulation film 22 is preferably composed of a layer insulation material, suitably an oxide, BPSG, SOG or PE-TEOS, formed by chemical vapor deposition.

If the first insulation layer 22 has inferior mechanical properties that makes it difficult to carry out chemical mechanical polishing on a metal to be deposited at a later step, an insulation layer (not shown) such as a silicon oxide film may be formed on the first insulation layer 22 to function as an etch stopper during chemical mechanical polishing.

Then, a first barrier metal layer 24 is formed at the upper portion of the first insulation layer 22 and in the first trench 22a. A first metal layer 26 is then formed on the first barrier metal layer 24. As a result, the first trench 22a is filled with the first metal layer 26. The first barrier metal layer 24 is preferably one of TiN, Ta, TaN and WNx and combinations thereof, and the first metal layer 26 is preferably copper.

Figure 3B:
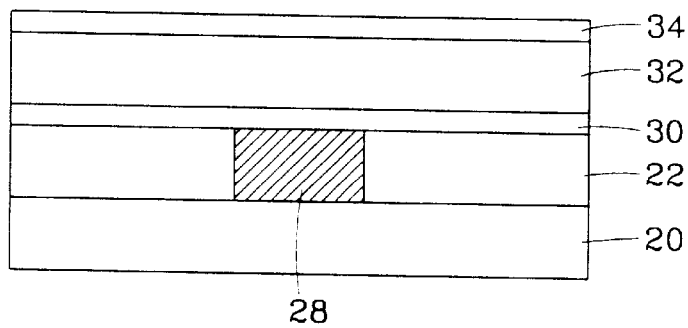

As illustrated in FIG. 3B, the first barrier metal layer 24 and first metal layer 26 are partially removed by chemical mechanical polishing, so that the upper portion of the first insulation layer 22 is exposed, and a first interconnection layer 28 is formed in the first trench 22a. Then, a second insulation layer 30, a third insulation layer 32 and a fourth insulation layer 34 are formed on the first insulation layer 22 and the first interconnection layer 28. The second insulation layer 30 is preferably a silicon nitride, which is a metal cap insulation material. The third insulation layer 32 is preferably an insulation material with a low dielectric constant, and the fourth insulation layer 34 is preferably silicon oxide. Hydrogen silsesquoxane (HSQ) is preferably employed as the insulation material with a low dielectric constant (the third insulation layer 32).

Figure 3C:
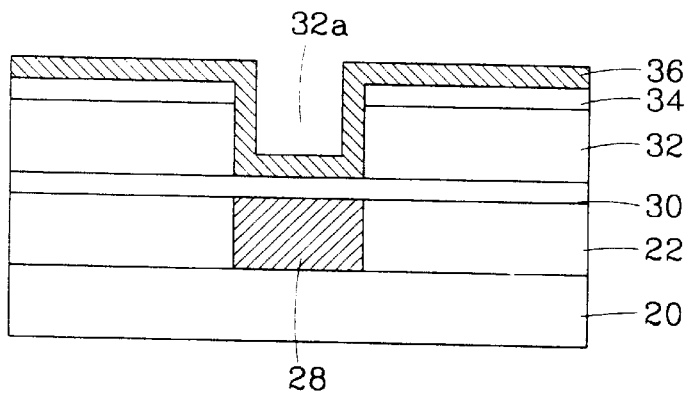

As shown in FIG. 3C, portions of the third and fourth insulation layers 32, 34 corresponding to the first interconnection layer 28 are removed, preferably by reaction ion etching using a photoresist film pattern (not shown) as a mask. Thus, a second trench 32a is formed in the third insulation layer 32. The second insulation layer 30 functions as an etch stopper during the etching. Thereafter, a second barrier metal layer 36 is formed on the upper portion of the fourth insulation layer 34 and in the second trench 32a. The second barrier metal layer 36 is preferably one of TiN, Ta, TaN, WNx and combinations thereof.

Figure 3D:
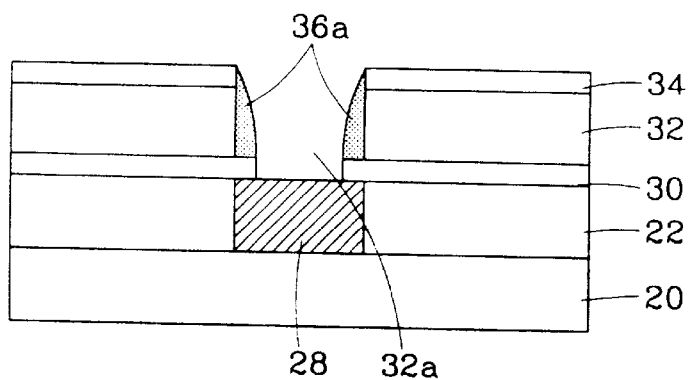

As depicted in FIG. 3D, the second barrier metal layer 36 is removed, preferably by anisotropic etching, so that the upper portion of the fourth insulation layer 34 is exposed. Thus, a sidewall spacer 36a is formed at the sidewalls of the fourth insulation layer 34 and the inner sidewalls of the second trench 32a.

A portion of the second insulation layer 30 exposed by the second trench 32a is removed, preferably by reaction ion etching using an oxygen plasma. As a result, the first interconnection layer 28 is partially exposed through the second trench 32a. The sidewall spacer 36a functions as a protective film that prevents the sidewalls of the second insulation layer 30 in the second trench 32a from being damaged by the oxygen plasma during the reaction ion etching.

Figure 3E:
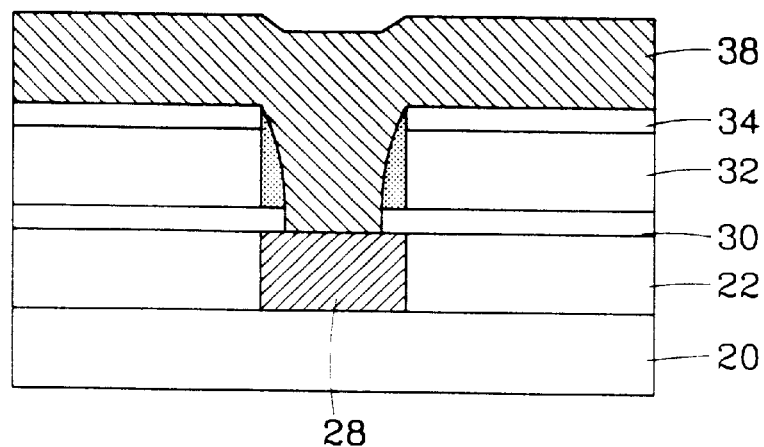

As illustrated in FIG. 3E, a second metal layer 38 is formed on the upper portion of the fourth insulation layer 34 and in the second trench 32a. Accordingly, the second trench 32a is completely filled with the second metal layer 38.

Figure 3F:
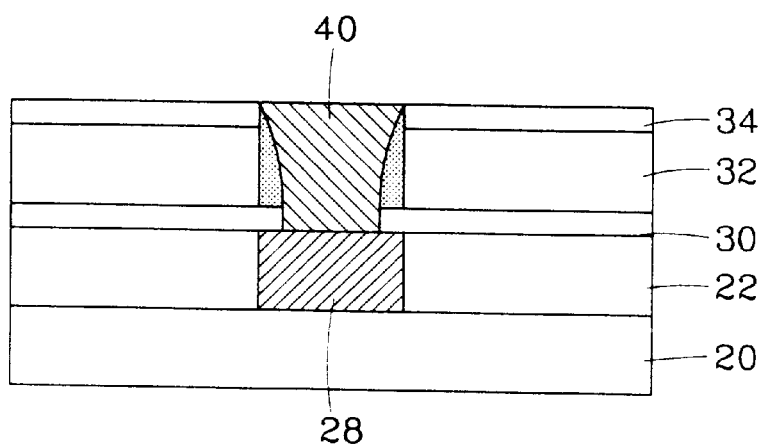

As shown in FIG. 3F, the second metal layer 38 is chemically mechanically polished so that the upper portion of the fourth insulation layer 34 is exposed. Thus, a second interconnection layer 40 is formed in the second trench 32a.

The second interconnection layer 40 contacts the first interconnection layer 28. The fourth insulation layer 34 functions as an etch stopper during the chemical mechanical polishing.

Although a two-layer interconnection structure has been illustrated, the present invention is not limited to two-layer structures. It should be recognized that the present invention may also be employed to form a three-layer interconnection, a four-layer interconnection, etc. Generally, interconnections having any number (N) of layers can be formed with the method of present invention.

The method of forming an interconnection in a semiconductor device according to the present invention has various advantages. For example, as illustrated in FIG. 3D, the sidewall spacer 36a is formed on the inner sidewalls of the second trench 32a, and the second insulation layer 30 is removed by etching, thereby preventing the sidewalls of the third insulation layer 32 from being caved. Further, as depicted in FIG. 3F, the second trench 32a is completely filled with the second interconnection layer 40, thereby improving the mass productivity and reliability of the interconnection. Moreover, when the second interconnection layer 40 is formed in the second trench 32a that contains the sidewall spacer 36a, only the second metal layer 38 is removed by the chemical mechanical polishing, thus simplifying the entire process. The sidewall spacer 36a also makes it easier to fill the second trench 32a with metal.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of forming an interconnection in a semiconductor device, comprising:

forming a first insulation layer on a semiconductor substrate;

forming a first trench in the first insulation layer;

forming a first interconnection layer in the first trench;

forming a second insulation layer on the first insulation layer and the first interconnection layer;

forming a third insulation layer on the second insulation layer;

forming a fourth insulation layer on the third insulation layer;

forming a second trench in the third and fourth insulation layers;

forming a sidewall spacer on sidewalls of the second trench;

removing a portion of the second insulation layer exposed by the second trench; and forming a second interconnection layer in the second trench by:

forming a second metal layer comprising copper on an upper portion of the fourth insulation layer and in the second trench so that the second trench is filled with the second metal layer; and removing portions of the second metal layer so that the upper portion of the fourth insulation layer is exposed, wherein the step of forming the sidewall spacer comprises:

forming a second barrier metal layer on an upper portion of the fourth insulation layer and in the second trench; and removing the second barrier metal layer by anisotropic etching so that the upper portion of the fourth insulation layer is exposed, the second barrier metal layer being selected from the group consisting TiN, Ta, TaN and WNx.

2. The method of claim 1, wherein the first insulation layer is selected from the group consisting of oxide, BPSG, SOG and PE-TEOS.

3. The method of claim 1, wherein the step of forming the first interconnection layer comprises the steps of:

forming a first barrier metal layer on an upper portion of the first insulation layer and in the first trench;

forming a first metal layer on the first barrier metal layer so that the first trench is filled with the first metal layer; and removing portions of the first barrier metal layer and the first metal layer so that the upper portion of the first insulation layer is exposed.

4. The method of claim 3, wherein the first barrier metal layer is selected from the group consisting of TiN, Ta, TaN, and WNx.

5. The method of claim 3, wherein the first metal layer comprises copper.

6. The method of claim 3, wherein the first insulation layer comprises an etch stopper.

7. The method of claim 1, wherein the second insulation layer comprises silicon nitride.

8. The method of claim 1, wherein the third insulation layer comprises an insulation material with a low dielectric constant.

9. The method of claim 8, wherein the insulation material with the low dielectric constant comprises hydrogen silsesquoxane (HSQ).

10. The method of claim 1, wherein the fourth insulation layer comprises silicon oxide.

11. The method of claim 1, wherein the portion of the second insulation layer exposed by the second trench is removed by etching.

12. The method of claim 11, wherein the portion of the second insulation layer exposed by the second trench is removed by reaction ion etching using an oxygen plasma.

13. The method of claim 1, wherein the fourth insulation layer comprises an etch stopper.

14. A method of forming an interconnection in a semiconductor device, comprising:

forming a first insulation layer on a substrate;

forming a second insulation layer on the first insulation layer, the second insulation layer comprising hydrogen silsesquoxane(HSQ);

forming a trench in the second insulation layer that exposes a portion of the first insulation layer;

forming a sidewall spacer on sidewalls of the trench, the sidewall spacer being selected from the group consisting of TiN, Ta, TaN and WNx;

removing the portion of the first insulation layer exposed by the trench by reactive ion etching; and forming an interconnection layer in the trench, wherein the sidewall spacer is adapted to shield the sidewalls of the trench while the portion of the first insulation layer exposed by the trench is removed.

15. The method of claim 14, further comprising the step of forming a third insulation layer on the second insulation layer before forming the trench.

16. A method of forming an interconnection in a semiconductor device, comprising:

forming a first insulation layer on a substrate;

forming a second insulation layer on the first insulation layer, the second insulation layer comprising hydrogen silsesquoxane (HSQ), exposing a portion of the first insulation layer by forming a trench in the second insulation layer, the second insulation layer having a sidewall profile;

removing the portion of the first insulation layer exposed by the trench by reaction ion etching while maintaining the sidewall profile of the trench; and forming an interconnection layer in the trench, wherein the sidewall profile of the trench is maintained by forming a protective material, the protective material being selected from the group consisting of TiN, Ta, TaN and WNx, on the sidewalls of the trench prior to removing the portion of the first insulation layer exposed by the trench, the protective material being adapted to protect the sidewalls of the trench from the process used to remove the portion of the first insulation layer.

17. The method of claim 16, further comprising the step of forming a third insulation layer on the second insulation layer before forming the trench.

\* \* \* \* \*